United States Patent
Bang

(10) Patent No.: US 11,404,293 B2
(45) Date of Patent: Aug. 2, 2022

(54) COOLING UNIT AND SUBSTRATE TREATING APPARATUS INCLUDING THE SAME

(71) Applicant: SEMES CO., LTD., Chungcheongnam-do (KR)

(72) Inventor: Jaeoh Bang, Seoul (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 97 days.

(21) Appl. No.: 16/931,175

(22) Filed: Jul. 16, 2020

(65) Prior Publication Data
US 2021/0020471 A1    Jan. 21, 2021

(30) Foreign Application Priority Data

Jul. 18, 2019   (KR) .................. 10-2019-0087033

(51) Int. Cl.
  *H01L 21/67*     (2006.01)
  *H05K 7/20*      (2006.01)
  *H01L 21/687*    (2006.01)

(52) U.S. Cl.
  CPC .. *H01L 21/67109* (2013.01); *H01L 21/67248* (2013.01); *H05K 7/20509* (2013.01); *H01L 21/68721* (2013.01)

(58) Field of Classification Search
  CPC ......... H01L 21/67109; H01L 21/67248; H01L 21/68721; H01L 21/67346; H01L 21/67748; H01L 21/68707; H01L 21/67178; H01L 21/67098; H01L 21/67017; H01L 21/683; H05K 7/20509
  See application file for complete search history.

(56) References Cited

U.S. PATENT DOCUMENTS

| | | | | |
|---|---|---|---|---|
| 2010/0297659 A1* | 11/2010 | Yoo | .................. | B01L 3/502753 |
| | | | | 435/6.16 |
| 2016/0045841 A1* | 2/2016 | Kaplan | .................. | C01B 32/05 |
| | | | | 429/49 |
| 2019/0267218 A1* | 8/2019 | Wang | .................. | H01L 21/6831 |
| 2020/0393766 A1* | 12/2020 | Kim | ........................ | G03F 7/162 |

(Continued)

FOREIGN PATENT DOCUMENTS

| | | | |
|---|---|---|---|
| JP | 2002124558 A | 4/2002 | |
| JP | 2006032701 A | 2/2006 | |

(Continued)

OTHER PUBLICATIONS

Notice of Allowance for related Korean Patent Application No. 10-2019-0087033 dated Aug. 6, 2020 (5 pages).

*Primary Examiner* — Mohammed Shamsuzzaman
(74) *Attorney, Agent, or Firm* — Procopio, Cory, Hargreaves & Savitch LLP

(57) ABSTRACT

A cooling unit for cooling a substrate includes a plate having a fluid channel formed therein and a fluid supply member that supplies a fluid into the fluid channel. The fluid channel includes a plurality of first fluid channels, each of which is connected with the fluid supply member at one end thereof and a second fluid channel that is connected with opposite ends of the plurality of first fluid channels and that discharges the fluid. A buffer space that connects the opposite ends of the plurality of first fluid channels and one end of the second fluid channel is formed inside the plate.

14 Claims, 10 Drawing Sheets

(56) References Cited

U.S. PATENT DOCUMENTS

| | | | | |
|---|---|---|---|---|
| 2020/0409275 A1* | 12/2020 | Bang | ................... | H01L 21/6838 |
| 2021/0050235 A1* | 2/2021 | Yun | ................... | H01L 21/67115 |
| 2021/0129175 A1* | 5/2021 | Bang | ................ | H01L 21/68707 |
| 2021/0132499 A1* | 5/2021 | Bae | ................... | H01L 21/68707 |
| 2021/0134620 A1* | 5/2021 | Lee | ....................... | F27D 5/0037 |
| 2021/0335585 A1* | 10/2021 | Cord | ..................... | C23C 14/568 |

FOREIGN PATENT DOCUMENTS

| | | | |
|---|---|---|---|
| JP | 4732978 | B2 | 4/2011 |
| KR | 10-0521373 | B1 | 10/2005 |
| KR | 10-2017-0078890 | A | 7/2017 |
| KR | 101935945 | B1 | 1/2019 |

* cited by examiner

Prior Art

COOLING UNIT AND SUBSTRATE TREATING APPARATUS INCLUDING THE SAME

CROSS-REFERENCE TO RELATED APPLICATIONS

A claim for priority under 35 U.S.C. § 119 is made to Korean Patent Application No. 10-2019-0087033 filed on Jul. 18, 2019, in the Korean Intellectual Property Office, the entire contents of which are hereby incorporated by reference.

BACKGROUND

Embodiments of the inventive concept described herein relate to a cooling unit and a substrate treating apparatus including the same.

In general, various processes, such as cleaning, deposition, photolithography, etching, ion implantation, and the like, are performed to manufacture semiconductor elements. The photolithography process for forming a pattern plays an important role in achieving high density integration of the semiconductor elements.

The photolithography process is performed to form a pattern on a substrate. In the photolithography process, a coating process, an exposing process, and a developing process are sequentially performed, and each of the processes includes a plurality of substrate treating steps. After one of the substrate treating steps is performed, the substrate is temporarily stored for the next step. Because the treated substrate generally remains in a high-temperature state, a process of cooling the substrate is performed while the substrate is temporarily stored. Accordingly, a substrate treating apparatus for performing the photolithography process on the substrate generally includes a cooling plate for cooling the substrate while the substrate is temporarily stored.

FIG. 1 is a perspective view illustrating a general cooling plate. Referring to FIG. 1, the cooling plate 5000 generally has a cooling line 5100 formed therein in which cooling fluid flows. One end of the cooling line 5100 is connected with a supply line 5202 for supplying the cooling fluid. The supply line 5202 is connected with a refrigerant supply source 5200. An opposite end of the cooling line 5100 is connected with a discharge line 5204. The refrigerant supply source 5200 supplies the cooling fluid into the cooling line 5100. The cooling fluid supplied into the cooling line 5100 flows through the cooling line 5100 and is discharged to the outside through the discharge line 5204.

Cold heat of the cooling fluid lowers the temperature of the cooling plate 5000 while the cooling fluid flows along the cooling line 5100. The cooling plate 5000 exchanges heat with a substrate placed on the cooling plate 5100. However, the temperatures of the cooling fluid flowing in the cooling line 5100 differ from one another depending on regions of the cooling line 5100. For example, the temperature of the cooling fluid at the one end of the cooling line connected with the supply line 5202 differs from the temperature of the cooling fluid at the opposite end of the cooling line 5100 connected with the discharge line 5204. Therefore, the substrate may not be uniformly cooled.

SUMMARY

Embodiments of the inventive concept provide a cooling unit for efficiently treating a substrate and a substrate treating apparatus including the cooling unit.

Furthermore, embodiments of the inventive concept provide a cooling unit for efficiently cooling a substrate and a substrate treating apparatus including the cooling unit.

Moreover, embodiments of the inventive concept provide a cooling unit for uniformly cooling a substrate and a substrate treating apparatus including the cooling unit.

In addition, embodiments of the inventive concept provide a cooling unit for minimizing stagnation of a temperature adjustment fluid in a fluid channel when the temperature adjustment fluid is discharged from a temperature adjustment plate, and a substrate treating apparatus including the cooling unit.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for treating a substrate includes an index module including a load port on which a carrier having the substrate received therein is placed and a treating module that treats the substrate transferred from the index module. The treating module includes a process chamber that treats the substrate and a buffer chamber that temporarily stores the substrate. The buffer chamber includes a housing having a space therein and a cooling unit that cools the substrate in the space. The cooling unit includes a temperature adjustment plate having a fluid channel formed therein and a fluid supply member that supplies a temperature adjustment fluid into the fluid channel. The fluid channel includes a plurality of first fluid channels, each of which is connected with the fluid supply member at one end thereof and a second fluid channel that is connected with opposite ends of the plurality of first fluid channels and that discharges the temperature adjustment fluid. A buffer space that connects the opposite ends of the plurality of first fluid channels and one end of the second fluid channel is formed inside the temperature adjustment plate.

According to an embodiment, the buffer space may have a larger diameter than the plurality of first fluid channels.

According to an embodiment, the buffer space may have a larger diameter than the second fluid channel.

According to an embodiment, the opposite ends of the plurality of first fluid channels may be connected with the buffer space, and the one end of the second fluid channel may be connected with the buffer space.

According to an embodiment, the buffer space may be formed in a central region of the temperature adjustment plate when viewed from above.

According to an embodiment, when viewed in a vertical section of the temperature adjustment plate, the plurality of first fluid channels may be formed in a region above the second fluid channel.

According to an embodiment, when viewed in the vertical section of the temperature adjustment plate, the buffer space may be formed in a region between the plurality of first fluid channels and the second fluid channel.

According to an embodiment, the temperature adjustment plate may include a first plate and a second plate provided under the first plate. The plurality of first fluid channels may be formed inside the first plate, and the second fluid channel may be formed inside the second plate.

According to an embodiment, the buffer space may be formed inside the first plate.

According to an embodiment, the temperature adjustment plate may be formed of a material containing aluminum, copper, or a carbon-based composite material.

According to an exemplary embodiment, a cooling unit for cooling a substrate includes a plate having a fluid channel formed therein and a fluid supply member that supplies a fluid into the fluid channel. The fluid channel includes a plurality of first fluid channels, each of which is connected with the fluid supply member at one end thereof and a second fluid channel that is connected with opposite ends of the plurality of first fluid channels and that discharges the fluid. A buffer space that connects the opposite ends of the plurality of first fluid channels and one end of the second fluid channel is formed inside the plate.

According to an embodiment, the buffer space may have a larger diameter than the plurality of first fluid channels and the second fluid channel.

According to an embodiment, the opposite ends of the plurality of first fluid channels may be connected with the buffer space, and the one end of the second fluid channel may be connected with the buffer space.

According to an embodiment, the buffer space may be formed in a central region of the plate when viewed from above.

According to an embodiment, when viewed in a vertical section of the plate, the plurality of first fluid channels may be formed in a region above the second fluid channel.

According to an embodiment, when viewed in the vertical section of the plate, the buffer space may be formed in a region between the plurality of first fluid channels and the second fluid channel.

According to an embodiment, the plate may include a first plate and a second plate provided under the first plate. The plurality of first fluid channels may be formed inside the first plate, and the second fluid channel may be formed inside the second plate.

According to an embodiment, the buffer space may be formed inside the first plate.

According to an embodiment, the plate may be a temperature adjustment plate that adjusts temperature of the substrate supported thereon, and the fluid may be a temperature adjustment fluid that changes temperature of the temperature adjustment plate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
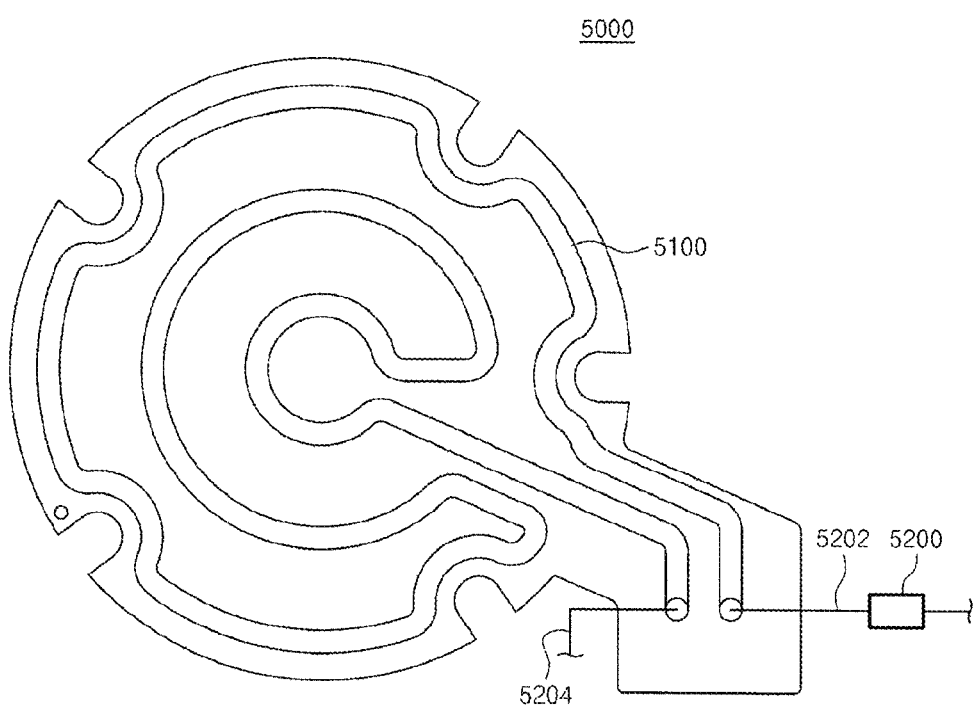
FIG. 1 is a perspective view illustrating a general cooling plate.

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms of a singular form may include plural forms unless otherwise specified. Furthermore, in the drawings, the shapes and dimensions of components may be exaggerated for clarity of illustration.

Figure 2:
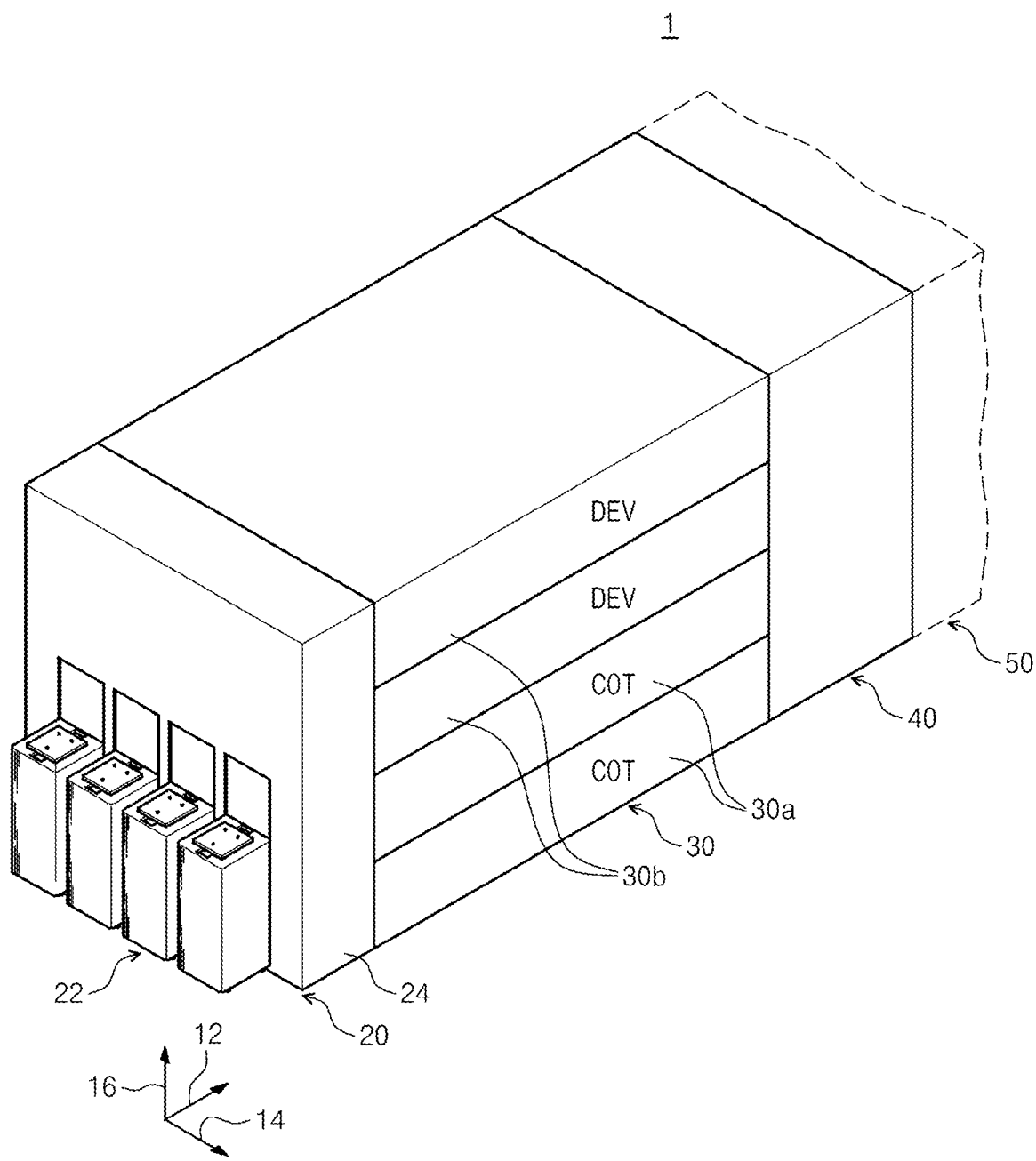
FIG. 2 is a schematic perspective view illustrating a substrate treating apparatus of the inventive concept.
Figure 3:
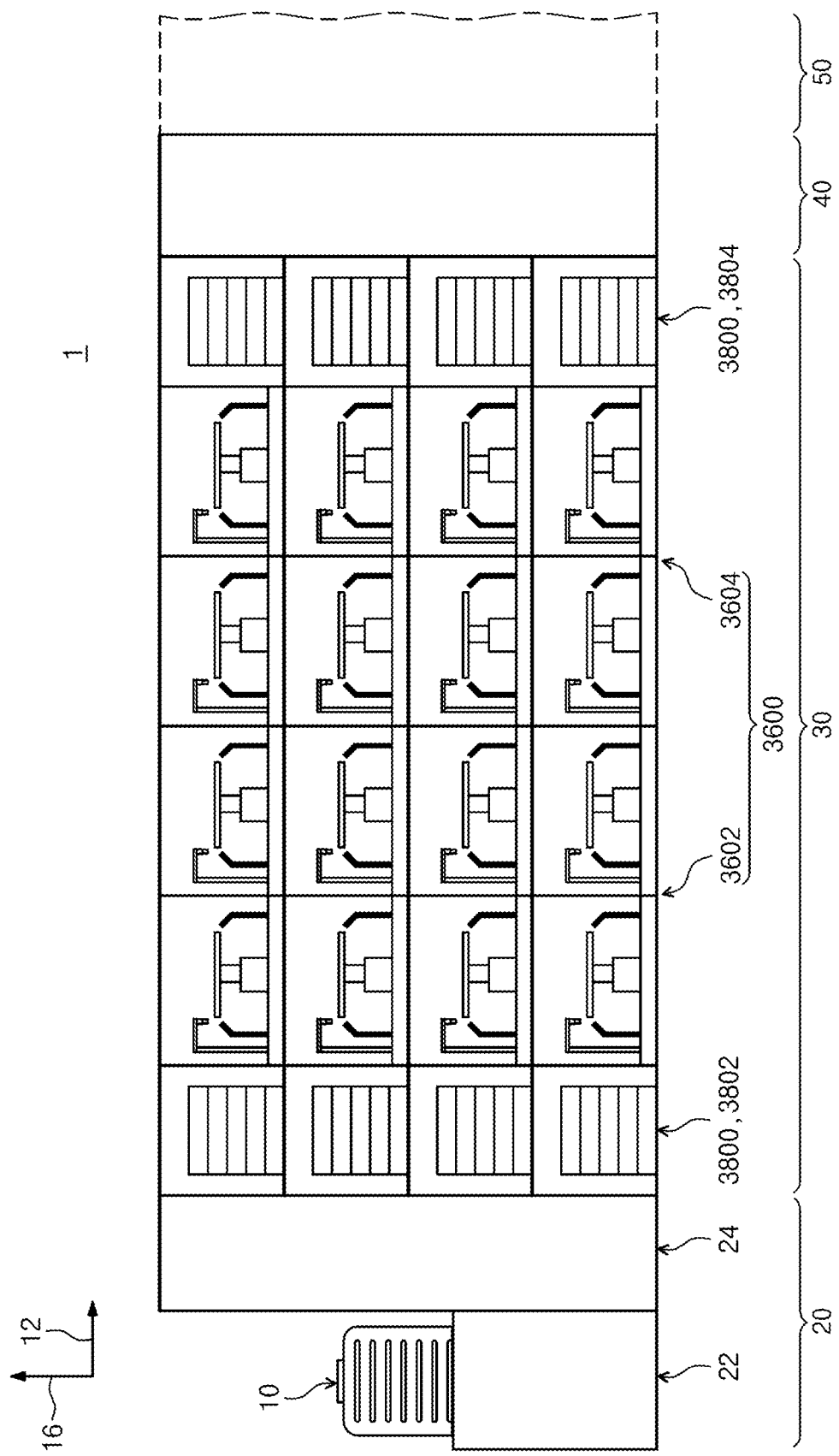
FIG. 3 is a sectional view illustrating coating blocks and developing blocks of the substrate treating apparatus of FIG. 2.
Figure 4:
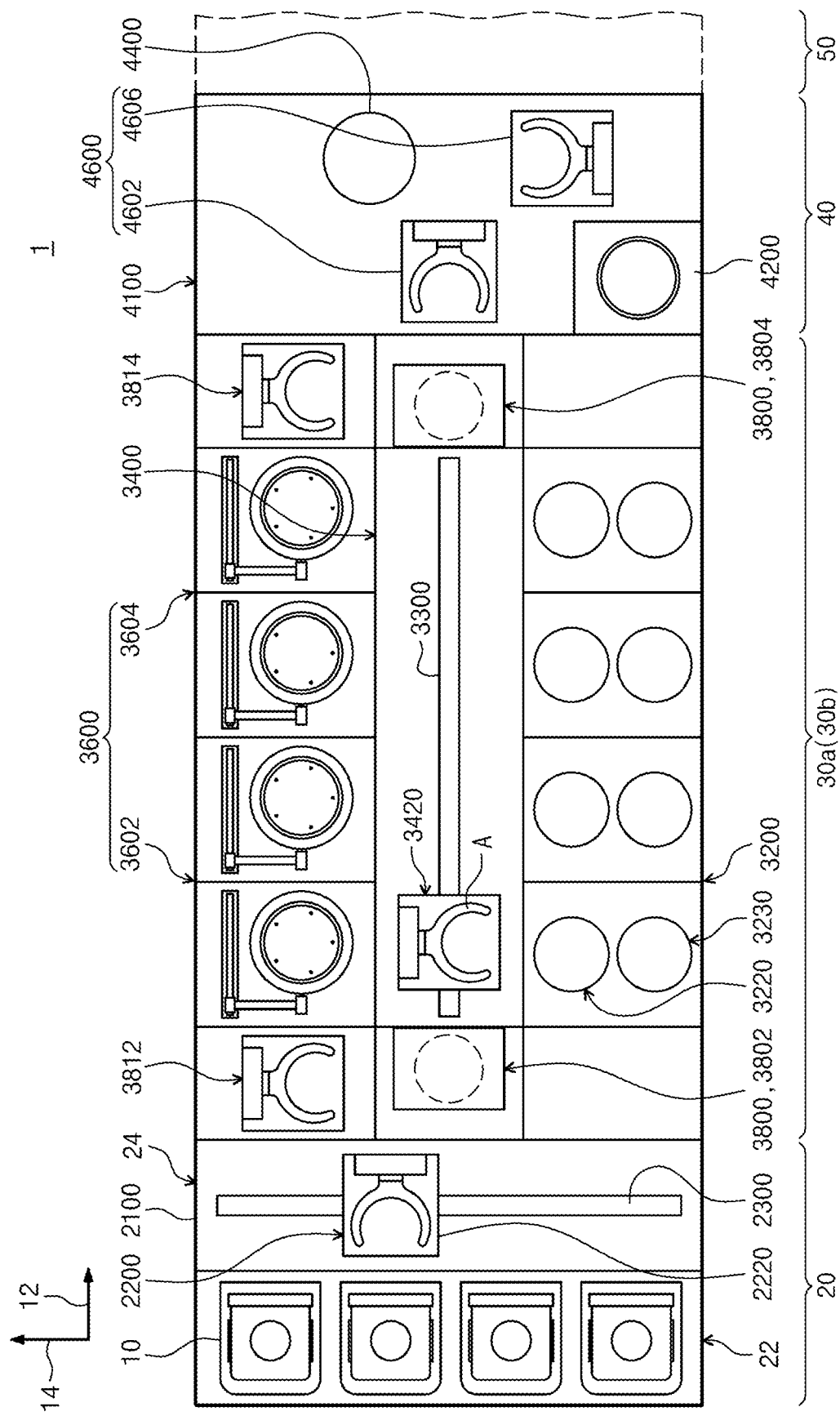
FIG. 4 is a plan view illustrating the substrate treating apparatus of FIG. 2.

FIG. 2 is a schematic perspective view illustrating a substrate treating apparatus of the inventive concept. FIG. 3 is a sectional view illustrating coating blocks and developing blocks of the substrate treating apparatus of FIG. 2. FIG. 4 is a plan view illustrating the substrate treating apparatus of FIG. 2.

Referring to FIGS. 2 to 4, the substrate treating apparatus 1 includes an index module 20, a treating module 30, and an interface module 40. According to an embodiment, the index module 20, the treating module 30, and the interface module 40 are sequentially disposed in a row. Hereinafter, a direction in which the index module 20, the treating module 30, and the interface module 40 are arranged is referred to as an X-axis direction 12, a direction perpendicular to the X-axis direction 12 when viewed from above is referred to as a Y-axis direction 14, and a direction perpendicular to both the X-axis direction 12 and the Y-axis direction 14 is referred to as a Z-axis direction 16.

The index module 20 transfers substrates W from carriers 10, in which the substrates W are received, to the treating module 30 and places the completely treated substrates W in the carriers 10. The lengthwise direction of the index module 20 is parallel to the Y-axis direction 14. The index module 20 may have load ports 22 on which the carriers 10 having the substrates W received therein are placed. Furthermore, the index module 20 has an index frame 24. The load ports 22 are located on the opposite side to the treating module 30 with respect to the index frame 24. The carriers 10 having the substrates W received therein are placed on the load ports 22. The load ports 22 may be disposed along the Y-axis direction 14.

Airtight carriers 10 such as front open unified pods (FOUPs) may be used as the carriers 10. The carriers 10 may be placed on the load ports 22 by a transfer means (not illustrated) such as an overhead transfer, an overhead conveyor, or an automatic guided vehicle, or by an operator.

An index robot 2200 is provided in the index frame 24. A guide rail 2300, the lengthwise direction of which is parallel to the Y-axis direction 14, is provided in the index frame 24. The index robot 2200 is movable on the guide rail 2300. The index robot 2200 includes a hand 2220 on which the substrate W is placed, and the hand 2220 is movable forward and backward, rotatable about an axis facing in the Z-axis direction 16, and movable along the Z-axis direction 16.

The treating module 30 may treat the substrates W transferred from the index module 20. The treating module 30 performs a coating process and a developing process on the substrates W. The treating module 30 has the coating blocks 30a and the developing blocks 30b. The coating blocks 30a perform the coating process on the substrates W, and the developing blocks 30b perform the developing process on the substrates W. The coating blocks 30a are stacked on each other. The developing blocks 30b are stacked on each other. According to the embodiment of FIG. 3, two coating blocks 30a and two developing block 30b are provided. The coating blocks 30a may be disposed under the developing blocks 30b. According to an embodiment, the two coating blocks 30a may perform the same process and may have the same structure. Furthermore, the two developing blocks 30b may perform the same process and may have the same structure.

Referring to FIG. 4, the coating blocks 30a have a heat treatment chamber 3200, a transfer chamber 3400, a liquid treatment chamber 3600, and a buffer chamber 3800. The heat treatment chamber 3200 performs a heat treatment process on the substrate W. The heat treatment process may include a cooling process and a heating process. The liquid treatment chamber 3600 forms a liquid film on the substrate W by dispensing a liquid onto the substrate W. The liquid film may be a photoresist film or an anti-reflection film. The transfer chamber 3400 transfers the substrate W between the heat treatment chamber 3200 and the liquid treatment chamber 3600 in the coating blocks 30a.

The transfer chamber 3400 is disposed such that the lengthwise direction thereof is parallel to the X-axis direction 12. A transfer unit 3420 is provided in the transfer chamber 3400. The transfer unit 3420 transfers the substrate W between the heat treatment chamber 3200, the liquid treatment chamber 3600, and the buffer chamber 3800. According to an embodiment, the transfer unit 3420 has a hand A on which the substrate W is placed, and the hand A is movable forward and backward, rotatable about an axis facing in the Z-axis direction 16, and movable along the Z-axis direction 16. A guide rail 3300, the lengthwise direction of which is parallel to the X-axis direction 12, is provided in the transfer chamber 3400. The transfer unit 3420 is movable on the guide rail 3300.

Figure 5:
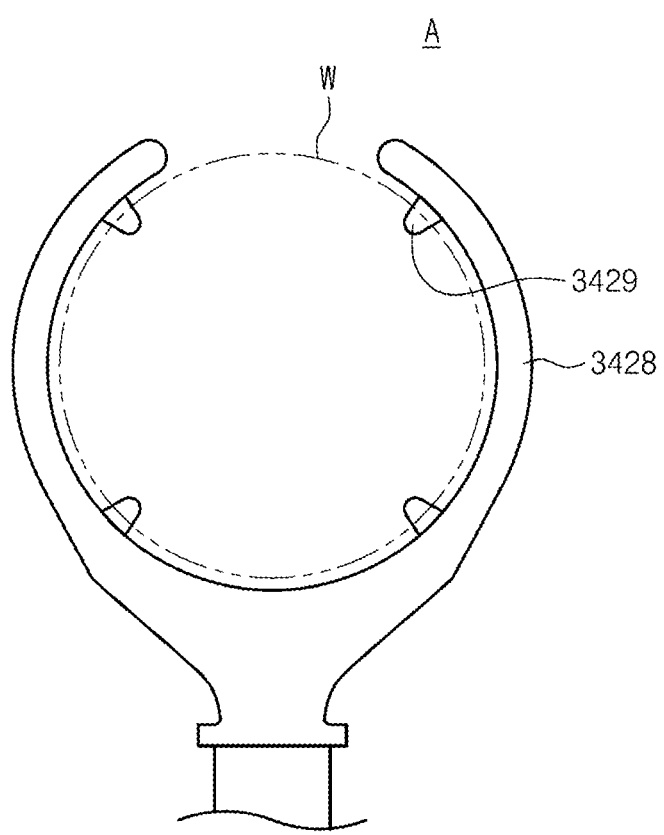
FIG. 5 is a view illustrating a hand of a transfer unit of FIG. 4.

FIG. 5 is a view illustrating one example of the hand of the transfer unit of FIG. 4. Referring to FIG. 4, the hand A has a base 3428 and support protrusions 3429. The base 3428 may have an annular ring shape, the circumference of which is partly curved. The base 3428 has an inner diameter larger than the diameter of the substrate W. The support protrusions 3429 extend inward from the base 3428. The support protrusions 3429 support an edge region of the substrate W. According to an embodiment, four support protrusions 3429 may be provided at equal intervals.

Referring again to FIGS. 3 and 4, a plurality of heat treatment chambers 3200 are provided. The heat treatment chambers 3200 are arranged along the X-axis direction 12. The heat treatment chambers 3200 are located on one side of the transfer chamber 3400.

Figure 6:
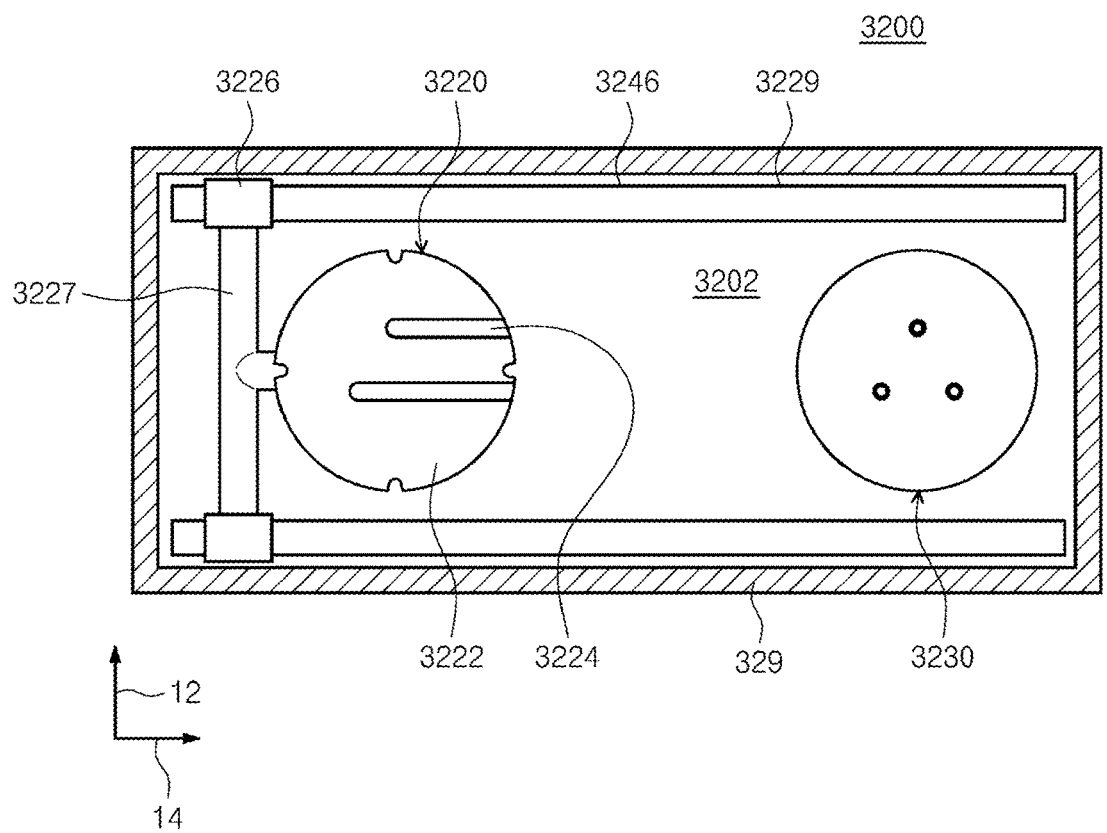
FIG. 6 is a schematic horizontal sectional view illustrating a heat treatment chamber of FIG. 4.
Figure 7:
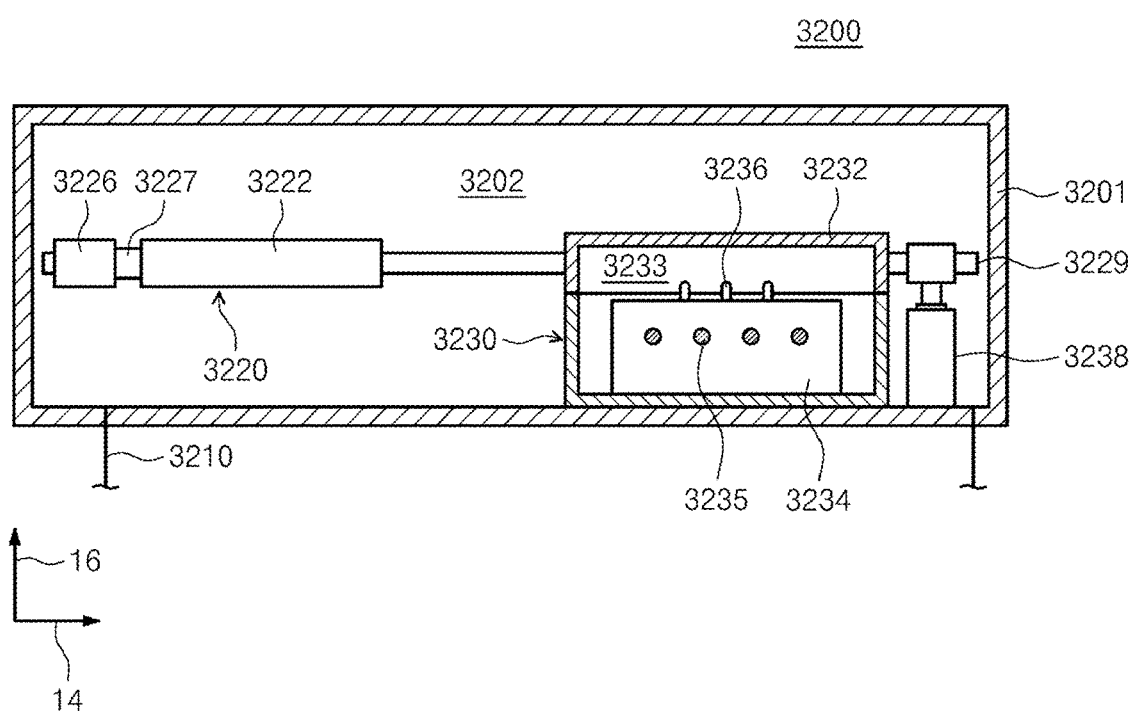
FIG. 7 is a front sectional view illustrating the heat treatment chamber of FIG. 6.

FIG. 6 is a schematic horizontal sectional view illustrating the heat treatment chamber of FIG. 4, and FIG. 7 is a front sectional view illustrating the heat treatment chamber of FIG. 6. The heat treatment chamber 3200 includes a treating container 3201, a cooling unit 3220, and a heating unit 3230.

The treating container 3201 has an interior space 3202. The treating container 3201 has a substantially rectangular parallelepiped shape. The treating container 3201 has, in a sidewall thereof, an entrance/exit opening (not illustrated) through which the substrate W enters or exits the treating container 3201. Furthermore, a door (not illustrated) may be provided to open or close the entrance/exit opening. Selectively, the entrance/exit opening may remain open. The entrance/exit opening may be formed in a region adjacent to the cooling unit 3220. The cooling unit 3220, the heating unit 3230, and a measurement unit 3240 are provided in the interior space 3202 of the treating container 3201. The cooling unit 3220 and the heating unit 3230 are provided side by side along the Y-axis direction 14. An exhaust line 3210 may be connected to the treating container 3201. The exhaust line 3210 may release, to the outside of the treating container 3201, a gas supplied by a fan unit 3250. The exhaust line 3210 may be connected to the bottom of the treating container 3201. Without being limited thereto, however, the exhaust line 3210 may be connected to a side of the treating container 3201.

The cooling unit 3220 has a cooling plate 3222. The cooling plate 3222 may have the substrate W seated thereon. The cooling plate 3222 may have a substantially circular shape when viewed from above. A cooling member (not illustrated) is provided inside the cooling plate 3222. According to an embodiment, the cooling member may be formed inside the cooling plate 3222 and may serve as a fluid channel in which a cooling fluid flows. Accordingly, the cooling plate 3222 may cool the substrate W. The cooling plate 3222 may have a diameter corresponding to the substrate W. The cooling plate 3222 may have notches formed at the edge thereof. The notches may have a shape corresponding to the support protrusions 3429 formed in the hand A described above. Furthermore, as many notches as the support protrusions 3429, which are formed in the hand A, may be formed in positions corresponding to the support protrusions 3429. When the vertical positions of the hand A and the cooling plate 3222 are changed, the substrate W is transferred between the hand A and the cooling plate 3222. A plurality of guide grooves 3242 in a slit shape are formed in the cooling plate 3222. The guide grooves 3224 extend inward from the edge of the cooling plate 3222. The lengthwise direction of the guide grooves 3224 is parallel to the Y-axis direction 14, and the guide grooves 3224 are located to be spaced apart from each other along the X-axis direction 12. The guide grooves 3224 prevent the cooling plate 3222 and lift pins 3236 from interfering with each other when the substrate W is transferred between the cooling plate 3222 and the heating unit 3230.

The cooling plate 3222 may be supported by a support member 3237. The support member 3237 may include a first support member having a rod shape and a second support member coupled to the center of the first support member.

One end and an opposite end of the first support member are coupled with an actuator 3226. The actuator 3226 is mounted on guide rails 3229. When viewed from above, the lengthwise direction of the guide rails 3229 may be parallel to the Y-axis direction 14, and the guide rails 3229 may be provided on opposite sides of the treating container 3201. The cooling plate 3222 may be moved along the Y-axis direction 14 by the actuator 3226 mounted on the guide rails 3229.

The heating unit 3230 may include a housing 3232, a heating plate 3234, a heater 3235, the lift pins 3236, and a drive member 3238. The housing 3232 may include a body and a cover. The body may be disposed under the cover. The body may have a shape that is open at the top. The body may have a cylindrical shape that is open at the top. The cover may cover the open top of the body. The cover may have a cylindrical shape that is open at the bottom. Alternatively, the cover may have a plate shape that covers the open top of the body. The body and the cover may be combined together to form a treatment space 3233. Furthermore, the cover may be connected with the drive member 3238 that moves the cover in an up-down direction. Accordingly, the cover may be moved in the up-down direction to open or close the treatment space 3233. For example, when the substrate W is loaded into or unloaded from the treatment space 3233, the cover may be moved upward to open the treatment space 3233. Furthermore, when the substrate W is treated in the treatment space 3233, the cover may be moved downward to close the treatment space 3233.

The heating plate 3234 may support the substrate W in the treatment space 3233. The heating plate 3234 may have the substrate W seated thereon. The heating plate 3234 has a substantially circular shape when viewed from above. The heating plate 3234 has a larger diameter than the substrate W. The heating plate 3234 is equipped with the heater 3235. The heater 3235 may be implemented with a resistance heating element to which electric current is applied. Accordingly, the heating plate 3234 may heat the substrate W. The heating plate 3234 has the lift pins 3236 that are vertically movable along the Z-axis direction 16. The lift pins 3236 receive the substrate W from a transfer means outside the heating unit 3230 and lay the substrate W down on the heating plate 3234, or raise the substrate W off the heating plate 3234 and transfer the substrate W to the transfer means outside the heating unit 3230. According to an embodiment, three lift pins 3236 may be provided.

Referring again to FIGS. 3 and 4, a plurality of buffer chambers 3800 are provided. Some of the buffer chambers 3800 are disposed between the index module 20 and the transfer chamber 3400. Hereinafter, these buffer chambers are referred to as the front buffers 3802. The front buffers 3802 are stacked one above another along the up-down direction. The other buffer chambers 3800 are disposed between the transfer chamber 3400 and the interface module 40. These buffer chambers are referred to as the rear buffers 3804. The rear buffers 3804 are stacked one above another along the up-down direction. The front buffers 3802 and the rear buffers 3804 temporarily store a plurality of substrates W. The substrates W stored in the front buffers 3802 are loaded or unloaded by the index robot 2200 and the transfer unit 3420. The substrates W stored in the rear buffers 3804 are loaded or unloaded by the transfer unit 3420 and a first robot 4602.

Figure 8:
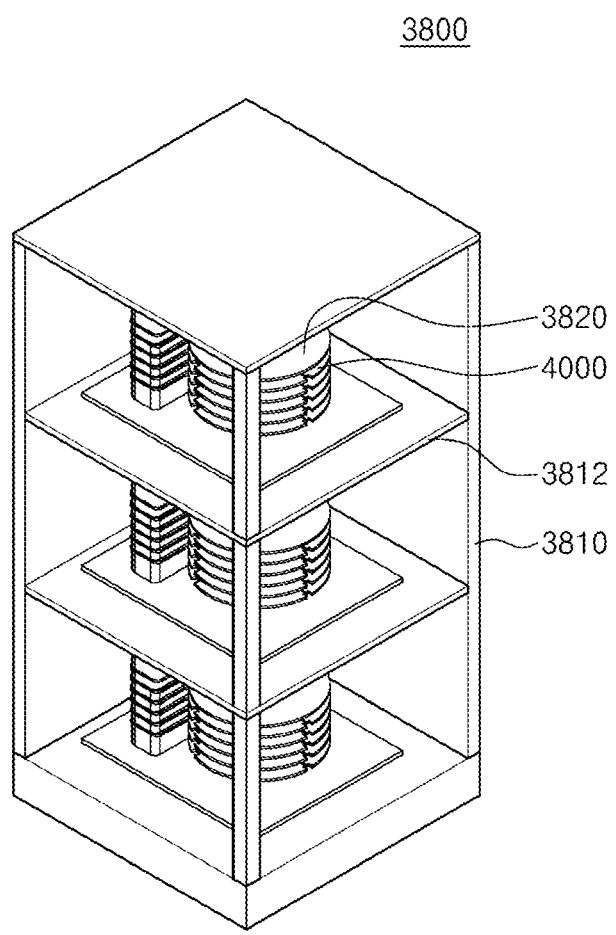
FIG. 8 is a schematic perspective view illustrating a buffer chamber of FIG. 4.

FIG. 8 is a schematic perspective view illustrating the buffer chamber of FIG. 4. Referring to FIG. 8, the buffer chamber 3800 may include a housing 3810, a buffer plate 3820, and a cooling unit 4000.

The housing 3810 has an interior space inside. The interior space of the housing 3810 functions as a space in which the substrates W are temporarily stored. The housing 3810 has a substantially rectangular parallelepiped shape. The housing 3810 is open at opposite sides thereof. For example, the opposite open sides of the housing 3810 are located opposite to each other, and one of the opposite open sides of the housing 3810 is provided to face toward the index module 20. The opposite open sides of the housing 3810 function as entrance/exit openings through which the substrates W enter or exit the housing 3810.

The housing 3810 has a support 3812 therein. The support 3812 may be implemented with a rectangular plate. A plurality of supports 3812 may be provided. The supports 3812 are located to be spaced apart from each other in the up-down direction. Accordingly, the interior space of the housing 3812 is partitioned into a plurality of interior spaces in the up-down direction. For example, three supports 3812 may be provided. Alternatively, two or fewer supports 3812 or four or more supports 3812 may be provided.

Figure 9:
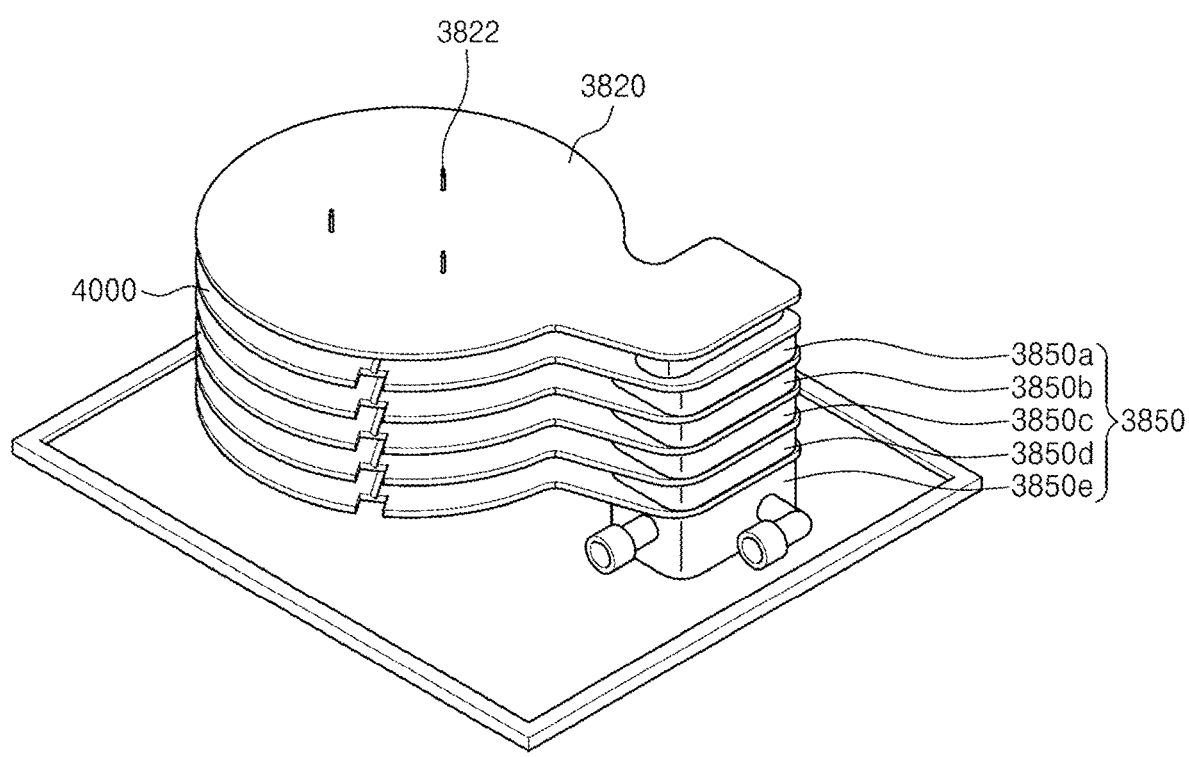
FIG. 9 is a perspective view illustrating a cooling unit, a buffer plate, and a support shaft of FIG. 8.

FIG. 9 is a perspective view illustrating the cooling unit, the buffer plate, and a support shaft of FIG. 8. Referring to FIG. 9, the buffer plate 3820 and the cooling unit 4000 are located in each of the plurality of interior spaces of the housing 3810 that are partitioned from each other. The buffer plate 3820 and the cooling unit 4000 may be located to be spaced apart from each other along the up-down direction. The buffer plate 3820 and the cooling unit 4000 are sequentially disposed along a direction from top to bottom. According to an embodiment, a plurality of cooling units 4000 may be provided, and the buffer plate 3820 and the plurality of cooling units 4000 may be sequentially disposed. Selectively, a plurality of buffer plates 3820 may be provided. The buffer plate 3820 and the cooling units 4000 may have a circular plate shape.

The plurality of cooling units 4000 may be disposed between the support 3812 and the buffer plate 3820. The plurality of cooling units 4000 are located to be spaced apart from each other along the up-down direction. The plurality of cooling units 4000 are stacked adjacent to each other. The substrates W may be seated on the cooling units 4000.

The support shaft 3850 supports the buffer plate 3820 and the cooling units 4000. The support shaft 3850 may include a plurality of support blocks 3850a, 3850b, 3850c, 3850d, and 3850e. The support blocks 3850a, 3850b, 3850c, 3850d, and 3850e are disposed to be stacked one above another. The support blocks 3850a, 3850b, 3850c, 3850d, and 3850e are implemented with blocks having a rectangular parallelepiped shape. The support blocks 3850a, 3850b, 3850c, 3850d, and 3850e support the cooling units 4000, respectively.

Figure 10:
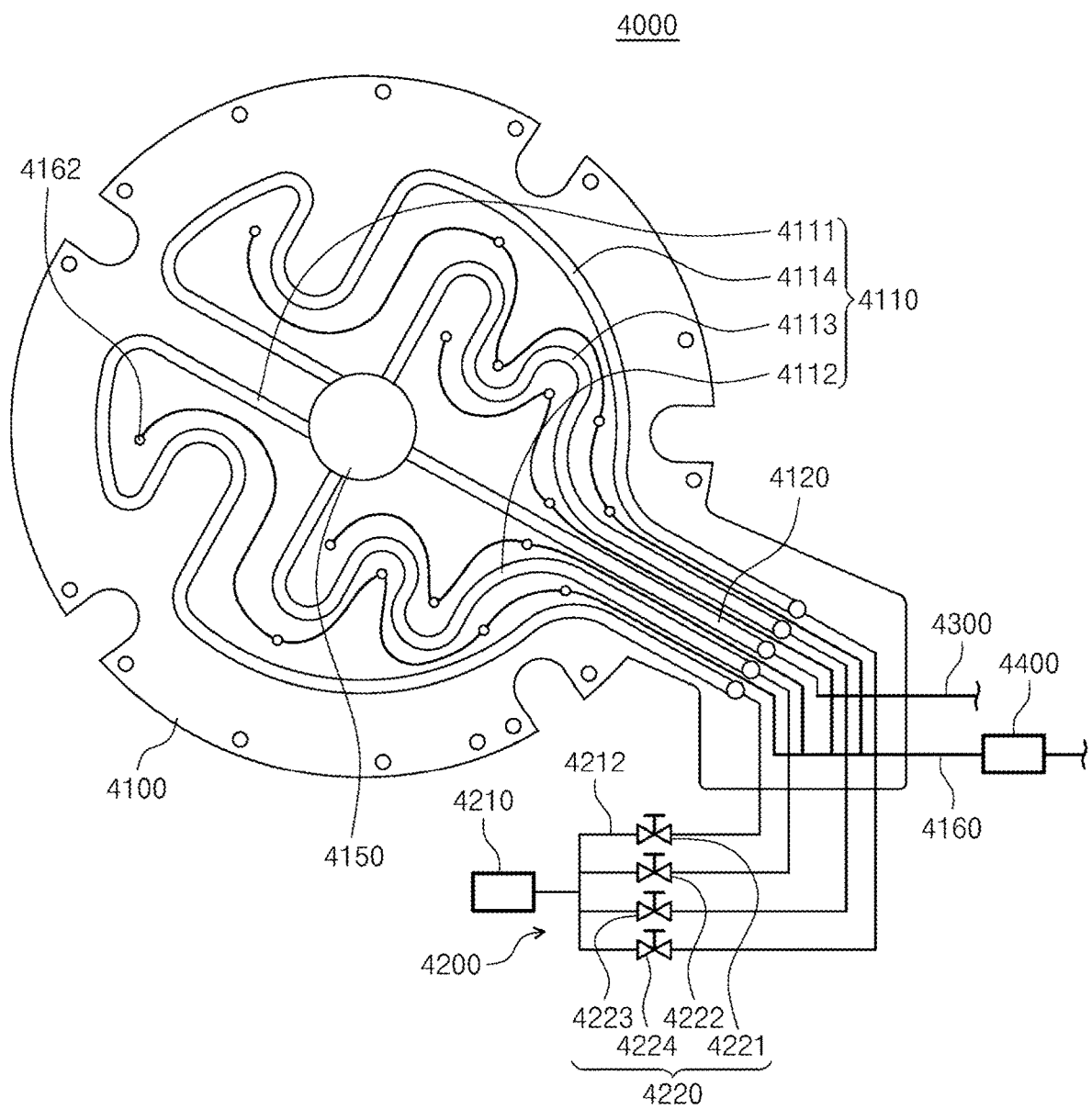
FIG. 10 is a plan view illustrating a cooling unit according to an embodiment of the inventive concept.
Figure 11:
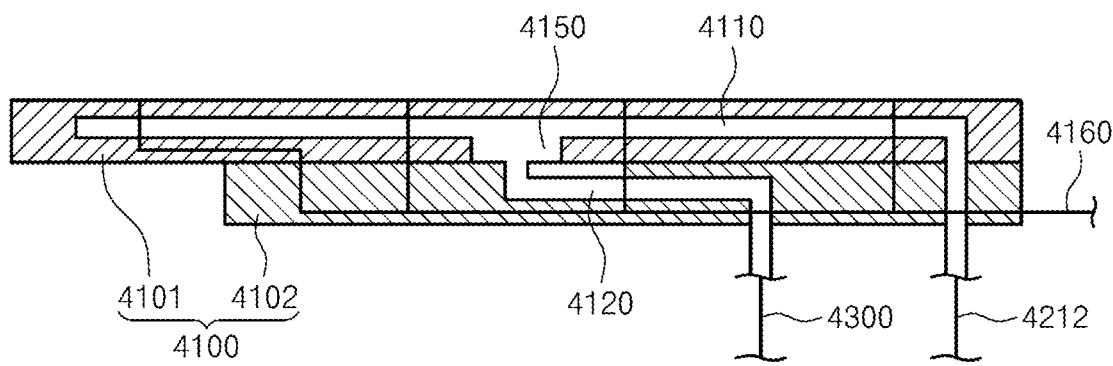
FIG. 11 is a sectional view illustrating the cooling unit of FIG. 10.

FIG. 10 is a plan view illustrating a cooling unit according to an embodiment of the inventive concept, and FIG. 11 is a sectional view illustrating the cooling unit of FIG. 10. The cooling unit 4000 may adjust the temperature of the substrate W supported on the cooling unit 4000. The cooling unit 4000 may lower the temperature of the substrate W supported on the cooling unit 4000. For example, the cooling unit 4000 may supply cold heat to the substrate W supported on the cooling unit 4000. Alternatively, the cooling unit 4000 may supply warm heat to the substrate W supported on the cooling unit 4000. The cooling unit 4000 includes a temperature adjustment plate 4100, a fluid supply member 4200, a discharge line 4300, and a pressure-reducing member 4400.

The temperature adjustment plate 4100 may have a substantially circular shape when viewed from above. The support plate 4100 may have a notch formed in an edge portion thereof. A plurality of notches may be formed. The temperature adjustment plate 4100 may be formed of a material containing metal. For example, the temperature adjustment plate 4100 may be formed of a material containing aluminum or copper. Alternatively, the temperature adjustment plate 4100 may be formed of a material containing a carbon-based composite material. For example, the temperature adjustment plate 4100 may be formed of a material containing a carbon-based composite material including graphite and copper.

The temperature adjustment plate 4100 may include a first plate 4101 and a second plate 4102. The second plate 4102 may be disposed under the first plate 4101. For example, a lower surface of the first plate 4101 and an upper surface of the second plate 4102 may make contact with each other. The first plate 4101 and the second plate 4102 may be formed of the same material. For example, the first plate 4101 and the second plate 4102 may be formed of a material containing metal. Alternatively, the first plate 4101 and the second plate 4102 may be formed of a material containing a carbon-based composite material.

The temperature adjustment plate 4100 may have fluid channels 4110 and 4120 formed therein. The fluid channels 4110 and 4120 may include the first fluid channel 4110 and the second fluid channel 4120.

A temperature adjustment fluid may be supplied into the first fluid channel 4110. The first fluid channel 4110 may include a plurality of fluid channels. For example, the first fluid channel 4110 may include fluid channel 1-1 4111, fluid channel 1-2 4112, fluid channel 1-3 4113, and fluid channel 1-4 4114. The first fluid channel 4110 may be formed in a middle region and an edge region of the temperature adjustment plate 4100. For example, fluid channel 1-1 4111, fluid channel 1-2 4112, fluid channel 1-3 4113, and fluid channel 1-4 4114 may be formed in the middle region and the edge region of the temperature adjustment plate 4100 when viewed from above. Parts of fluid channel 1-1 4111, fluid channel 1-2 4112, fluid channel 1-3 4113, and fluid channel 1-4 4114 may have a curved shape. One end of each of the plurality of first fluid channels 4110 may be connected with the fluid supply member 4200. The temperature adjustment fluid supplied by the fluid supply member 4200 may be supplied into the plurality of first fluid channels 4110. The plurality of first fluid channels 4110 may be formed inside the first plate 4101.

The second fluid channel 4120 may discharge, to the outside, the temperature adjustment fluid supplied into the plurality of first fluid channels 4110. The second fluid channel 4120 may be connected with opposite ends of the plurality of first fluid channels 4110. Only one second fluid channel 4120 may be provided. An opposite end of the second fluid channel 4120 may be connected with the discharge line 4300. When viewed in a vertical section of the temperature adjustment plate 4100, the plurality of first fluid channels 4110 may be formed in a region above the second fluid channel 4120. The second fluid channel 4120 may be formed inside the second plate 4101.

The temperature adjustment plate 4100 may have a buffer space 4150 formed therein.

The buffer space 4150 may be formed inside the temperature adjustment plate 4100. The buffer space 4150 may connect the plurality of first fluid channels 4110 and the second fluid channel 4120. The opposite ends of the plurality of first fluid channels 4110 may be connected to the buffer space 4150. Furthermore, one end of the second fluid channel 4120 may be connected to the buffer space 4150. The buffer space 4150 may be formed in a central region of the temperature adjustment plate 4100 when the temperature adjustment plate 4100 is viewed from above. When viewed in the vertical section of the temperature adjustment plate 4100, the buffer space 4150 may be formed in a region between the first fluid channels 4110 and the second fluid channel 4120. The buffer space 4150 may have a larger diameter than the first fluid channels 4110. The buffer space 4150 may have a larger diameter than the second fluid channel 4120. Furthermore, the buffer space 4150 may be formed inside the first plate 4101 of the temperature adjustment plate 4100.

A vacuum line 4160 may be formed inside the temperature adjustment plate 4100. The pressure-reducing member 4400 may apply negative pressure to the vacuum line 4160. The vacuum line 4160 may apply the negative pressure to a lower surface of the substrate W seated on the temperature adjustment plate 4100. The vacuum line 4160 may be formed inside the temperature adjustment plate 4100. The vacuum line 4160 may be formed between the first fluid channels 4110 when viewed from above. For example, the vacuum line 4160 may be formed between the first fluid channels 4110 adjacent to each other when viewed from above. The vacuum line 4160 may be split. For example, the vacuum line 4160 may be split into a plurality of branch lines. Each of the branch lines may be provided between the first fluid channels 4110 adjacent to each other.

One end of the vacuum line 4160 may be connected with the pressure-reducing member 4400. An opposite end of the vacuum line 4160 may be connected with suction holes 4162. The suction holes 4162 may be formed in an upper surface of the temperature adjustment plate 4100. The vacuum line 4160 may be formed inside the temperature adjustment plate 1400 and may extend to the upper surface of the temperature adjustment plate 4100. Accordingly, the vacuum line 4160 may be connected to the suction holes 4162.

The pressure-reducing member 4400 may apply negative pressure to the vacuum line 4160. The pressure-reducing member 4400 may be a pump. Without being limited thereto, however, the pressure-reducing member 4400 may be implemented with various well-known devices capable of applying negative pressure to the vacuum line 4160.

The fluid supply member 4200 may adjust the temperature of the temperature adjustment plate 4100. The fluid supply member 4200 may include a fluid supply source 4210, fluid supply lines 4212, and valves 4220. The fluid supply source 4210 may store a fluid. The fluid stored in the fluid supply source 4210 may be the temperature adjustment fluid. The temperature adjustment fluid may be a cooling fluid. For example, the temperature adjustment fluid may be cooling water. Without being limited thereto, however, the temperature adjustment fluid may be replaced by various fluids capable of adjusting the temperature of the temperature adjustment plate 4100.

The fluid supply source 4210 may be connected with the fluid supply lines 4212. The fluid supply lines 4212 may be connected with the first fluid channels 4110. The fluid supply lines 4212 may receive the temperature adjustment fluid from the fluid supply source 4210. Accordingly, the fluid supply lines 4212 may supply the temperature adjustment fluid to the first fluid channels 4110. The fluid supply lines 4212 may be divided from each other. The fluid supply lines 4212 divided from each other may be connected to the first fluid channels 4110, respectively. Furthermore, the fluid supply lines 4212 may be equipped with the valves 4220, respectively. The valves 4220 may be on/off valves. Alternatively, the valves 4220 may be flow-rate control valves.

The valves 4220 may include a first valve 4221, a second valve 4222, a third valve 4223, and a fourth valve 4224. The fluid supply line 4212 equipped with the first valve 4221 may be connected with fluid channel 1-1 4111. The fluid supply line 4212 equipped with the second valve 4222 may be connected with fluid channel 1-2 4112. The fluid supply line 4212 equipped with the third valve 4223 may be connected with fluid channel 1-3 4113. The fluid supply line 4212 equipped with the fourth valve 4224 may be connected with fluid channel 1-4 4114. That is, whether to supply the temperature adjustment fluid that flows in the first fluid channels 4110 may vary depending on on/off of the valves 4220. Furthermore, a supply flow rate per unit time of the temperature adjustment fluid flowing in each of the first fluid channels 4110 may vary depending on the valve-opening degree of the corresponding valve 4220.

A general cooling plate has a fluid channel formed therein in which a cooling fluid flows. The cooling fluid flowing in the fluid channel adjusts the temperature of the cooling plate. The cooling plate adjusts the temperature of a substrate by exchanging heat with the substrate placed on the cooling plate. However, the temperature of the cooling plate is not uniformly maintained in the process in which the cooling plate and the substrate exchange heat with each other. For example, the temperature of the cooling fluid flowing in a fluid channel adjacent to a refrigerant supply source differs from the temperature of the cooling fluid flowing in a fluid channel far away from the refrigerant supply source. The temperature of the cooling fluid flowing in the fluid channel adjacent to the refrigerant supply source may be lower than the temperature of the cooling fluid flowing in the fluid channel far away from the refrigerant supply source. Therefore, the temperature of the cooling plate is not uniformly maintained. As a result, the substrate may not be uniformly cooled.

Figure 12:
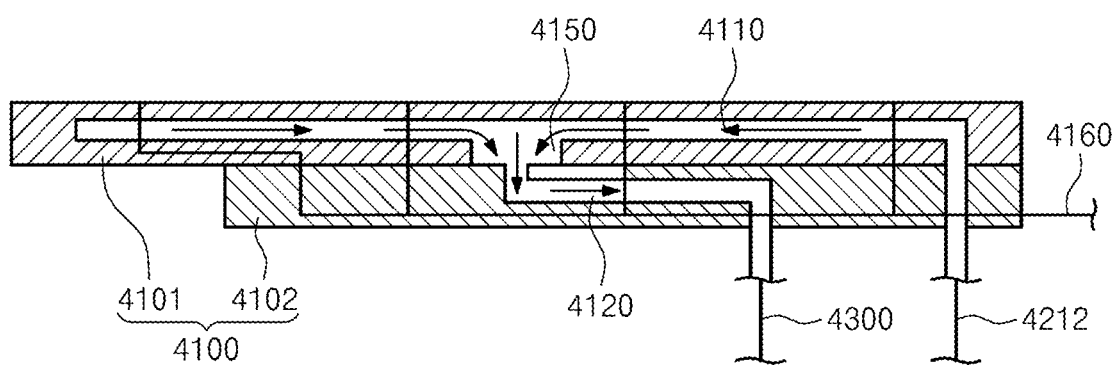
FIG. 12 is a view illustrating a state in which a temperature adjustment fluid flows in the cooling unit of FIG. 10.

However, according to the embodiment of the inventive concept, the temperature adjustment plate 4100 has the plurality of first fluid channels 4110 formed therein. Furthermore, the temperature adjustment fluid flowing in the plurality of first fluid channels 4110 is discharged to the outside through the single second fluid channel 4120. In other words, the first fluid channels 4110 formed inside the temperature adjustment plate 4100 have a short length. Accordingly, a deviation in the temperatures of the temperature adjustment fluid flowing in the first fluid channels 4110 is small. Thus, the temperature of the temperature adjustment plate 4100 may be uniformly maintained. In a case where the temperature adjustment fluid flowing in the plurality of first fluid channels 4110 is discharged to the outside through the single second fluid channel 4120, the flow of the temperature adjustment fluid may stagnate. However, according to the embodiment of the inventive concept, the first fluid channels 4110 and the second fluid channel 4120 are connected through the buffer space 4150. The buffer space 4150 has a larger diameter than the first fluid channels 4110 and the second fluid channel 4120. Accordingly, as illustrated in FIG. 12, stagnation of the temperature adjustment fluid may be minimized in the process in which the temperature adjustment fluid flowing in the first fluid channels 4110 is discharged to the outside through the second fluid channel 4120.

Referring again to FIGS. 2 to 4, the developing blocks 30b have heat treatment chambers 3200, a transfer chamber 3400, and liquid treatment chambers 3600. The heat treatment chambers 3200, the transfer chamber 3400, and the liquid treatment chambers 3600 of the developing blocks 30b are disposed in a structure substantially similar to the structure in which the heat treatment chambers 3200, the transfer chamber 3400, and the liquid treatment chambers 3600 of the coating blocks 30a are disposed. Therefore, descriptions thereabout will be omitted. However, the liquid treatment chambers 3600 in the developing blocks 30b are provided as developing chambers 3600, all of which identically dispense a developing solution to perform a developing process on the substrate W.

The interface module 40 connects the treating module 30 with an external exposing apparatus 50. The interface module 40 has an interface frame 4100, an additional process chamber 4200, an interface buffer 4400, and a transfer member 4600.

The interface frame 4100 may have, at the top thereof, a fan filter unit that forms a downward air flow in the interface frame 4100. The additional process chamber 4200, the interface buffer 4400, and the transfer member 4600 are disposed in the interface frame 4100. Before the substrate W completely processed in the coating blocks 30a is transferred to the exposing apparatus 50, the additional process chamber 4200 may perform a predetermined additional process on the substrate W. Selectively, before the substrate W completely processed in the exposing apparatus 50 is transferred to the developing blocks 30b, the additional process chamber 4200 may perform a predetermined additional process on the substrate W. According to an embodiment, the additional process may be an edge exposing process of exposing the edge region of the substrate W to light, a top-side cleaning process of cleaning the top side of the substrate W, or a backside cleaning process of cleaning the backside of the substrate W. A plurality of additional process chambers 4200 may be provided. The additional process chambers 4200 may be stacked one above another. The additional process chambers 4200 may all perform the same process. Selectively, some of the additional process chambers 4200 may perform different processes.

The interface buffer 4400 provides a space in which the substrate W transferred between the coating blocks 30a, the additional process chambers 4200, the exposing apparatus 50, and the developing blocks 30b temporarily stays. A plurality of interface buffers 4400 may be provided. The interface buffers 4400 may be stacked one above another.

According to an embodiment, the additional process chambers 4200 may be disposed on one side of an extension line facing in the lengthwise direction of the transfer chamber 3400, and the interface buffers 4400 may be disposed on an opposite side of the extension line.

The transfer member 4600 transfers the substrate W between the coating blocks 30a, the additional process chambers 4200, the exposing apparatus 50, and the developing blocks 30b. The transfer member 4600 may be implemented with one or more robots. According to an embodiment, the transfer member 4600 has the first robot 4602 and a second robot 4606. The first robot 4602 may transfer the substrate W between the coating blocks 30a, the additional process chambers 4200, and the interface buffers 4400. An interface robot 4606 may transfer the substrate W between the interface buffers 4400 and the exposing apparatus 50. The second robot 4606 may transfer the substrate W between the interface buffers 4400 and the developing blocks 30b.

Each of the first robot 4602 and the second robot 4606 includes a hand on which the substrate W is placed, and the hand is movable forward and backward, rotatable about an axis parallel to the Z-axis direction 16, and movable along the Z-axis direction 16.

Figure 13:
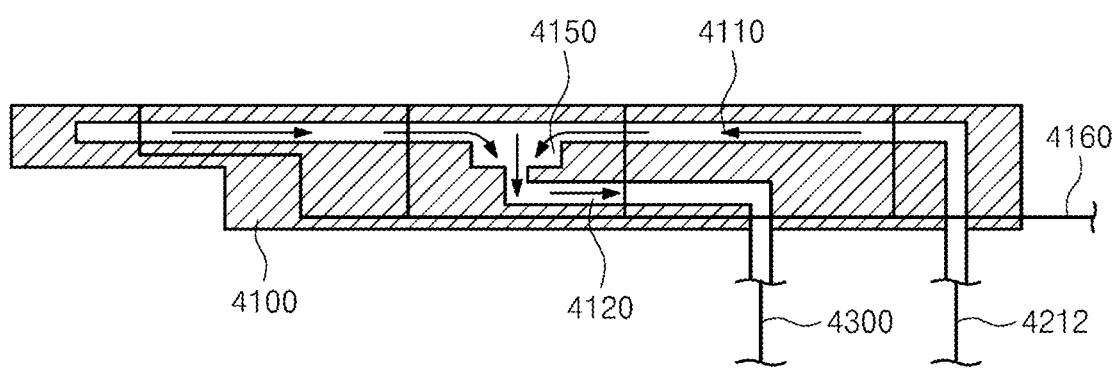
FIG. 13 is a sectional view illustrating a cooling unit according to another embodiment of the inventive concept.

Although it has been exemplified that the temperature adjustment plate 4100 includes the first plate 4101 and the second plate 4102, the temperature adjustment plate 4100 is not limited thereto. For example, as illustrated in FIG. 13, the temperature adjustment plate 4100 may have a configuration in which the first plate 4101 and the second plate 4102 are integrated with each other.

As described above, according to the embodiments of the inventive concept, the cooling unit and the substrate treating apparatus including the same may efficiently treat a substrate.

Furthermore, according to the embodiments of the inventive concept, the cooling unit and the substrate treating apparatus including the same may efficiently cool a substrate.

Moreover, according to the embodiments of the inventive concept, the cooling unit and the substrate treating apparatus including the same may uniformly cool a substrate.

In addition, according to the embodiments of the inventive concept, the cooling unit and the substrate treating apparatus including the same may minimize stagnation of the temperature adjustment fluid in the fluid channels when the temperature adjustment fluid is discharged from the temperature adjustment plate.

Effects of the inventive concept are not limited to the aforementioned effects, and any other effects not mentioned herein may be clearly understood from this specification and the accompanying drawings by those skilled in the art to which the inventive concept pertains.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
    an index module including a load port on which a carrier having the substrate received therein is placed;
    a treating module configured to treat the substrate transferred from the index module, wherein the treating module includes:
    a process chamber configured to treat the substrate;
    a buffer chamber configured to temporarily store the substrate, wherein the buffer chamber includes:
    a housing having a space therein; and
    a cooling unit configured to cool the substrate in the space, wherein the cooling unit includes:
    a temperature adjustment plate having a fluid channel formed therein;
    a fluid supply member configured to supply a temperature adjustment fluid into the fluid channel, wherein the fluid channel includes:
    a plurality of first fluid channels, each of which is connected with the fluid supply member at one end thereof;
    a second fluid channel connected with opposite ends of the plurality of first fluid channels and configured to discharge the temperature adjustment fluid,
    wherein a buffer space configured to connect the opposite ends of the plurality of first fluid channels and one end of the second fluid channel is formed inside the temperature adjustment plate;
    wherein the buffer space has a larger diameter than the plurality of first fluid channels and the second fluid channel; and
    wherein the buffer space is formed in a central region of the temperature adjustment plate when viewed from above.

2. The apparatus of claim 1, wherein the opposite ends of the plurality of first fluid channels are connected with the buffer space, and 5 wherein the one end of the second fluid channel is connected with the buffer space.

3. The apparatus of claim 1, wherein when viewed in a vertical section of the temperature adjustment plate, the plurality of first fluid channels are formed in a region above the second fluid channel.

4. The apparatus of claim 3, wherein when viewed in the vertical section of the temperature adjustment plate, the buffer space is formed in a region between the plurality of first fluid channels and the second fluid channel.

5. The apparatus of claim 1, wherein the temperature adjustment plate includes:
    a first plate; and
    a second plate provided under the first plate,
    wherein the plurality of first fluid channels are formed inside the first plate, and
    wherein the second fluid channel is formed inside the second plate.

6. The apparatus of claim 5, wherein the buffer space is formed inside the first plate.

7. The apparatus of claim 1, wherein the temperature adjustment plate is formed of a material containing aluminum, copper, or a carbon-based composite material.

8. A cooling unit for cooling a substrate, the cooling unit comprising:
    a temperature adjustment plate having a fluid channel formed therein;
    a fluid supply member configured to supply a temperature adjustment fluid into the fluid channel,
    wherein the fluid channel includes:
    a plurality of first fluid channels, each of which is connected with the fluid supply member at one end thereof;
    a second fluid channel connected with opposite ends of the plurality of first fluid channels and configured to discharge the fluid,
    wherein a buffer space configured to connect the opposite ends of the plurality of first fluid channels and one end of the second fluid channel is formed inside the plate,
    wherein the buffer space has a larger diameter than the plurality of first fluid channels and the second fluid channel; and
    wherein the buffer space is formed in a central region of the temperature adjustment plate when viewed from above; and wherein the cooling unit is inside a housing space of a buffer chamber of an apparatus for treating the substrate.

9. The cooling unit of claim 8, wherein the opposite ends of the plurality of first fluid channels are connected with the buffer space, and wherein the one end of the second fluid channel is connected with the buffer space.

10. The cooling unit of claim 8, wherein when viewed in a vertical section of the plate, the plurality of first fluid channels are formed in a region above the second fluid channel.

11. The cooling unit of claim 10, wherein when viewed in the vertical section of the plate, the buffer space is formed in a region between the plurality of first fluid channels and the second fluid channel.

12. The cooling unit of claim 8, wherein the plate includes:

a first plate; and a second plate provided under the first plate, wherein the plurality of first fluid channels are formed inside the first plate, and wherein the second fluid channel is formed inside the second plate.

13. The cooling unit of claim 12, wherein the buffer space is formed inside the first plate.

14. The cooling unit of claim 8, wherein the temperature adjustment plate is configured to adjust a temperature of the substrate supported thereon, and wherein the temperature adjustment fluid is configured to change a temperature of the temperature adjustment plate.

* * * * *